United States Patent
Baik et al.

(10) Patent No.: US 9,929,336 B2
(45) Date of Patent: Mar. 27, 2018

(54) SELF-POWERED GENERATOR, METHOD OF FABRICATING THE SAME AND PIEZOELECTRIC ENERY-HARVESTING DEVICE USING THE GENERATOR

(71) Applicant: Industry-Academic Cooperation Foundation, Yonsei Unversity, Seoul (KR)

(72) Inventors: Hong Koo Baik, Seoul (KR); Jae Min Myong, Goyang si (KR); Woo Soon Jang, Seoul (KR); Tae Il Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 736 days.

(21) Appl. No.: 14/261,604

(22) Filed: Apr. 25, 2014

(65) Prior Publication Data

US 2015/0188028 A1 Jul. 2, 2015

(30) Foreign Application Priority Data

Dec. 31, 2013 (KR) ........................ 10-2013-0168817

(51) Int. Cl.

| H01L 41/113 | (2006.01) |
|---|---|
| H02N 2/18 | (2006.01) |
| H01L 41/31 | (2013.01) |
| B82Y 15/00 | (2011.01) |

(52) U.S. Cl.
CPC ............ *H01L 41/113* (2013.01); *H01L 41/31* (2013.01); *H02N 2/18* (2013.01); *B82Y 15/00* (2013.01); *Y10S 977/948* (2013.01); *Y10T 29/42* (2015.01)

(58) Field of Classification Search
CPC .......... H02N 2/18; H01L 41/113; B82Y 15/00
USPC ............ 310/311, 323.01, 328, 329, 339, 354
IPC ............... H01L 41/09; B06B 1/06; H02N 2/18
See application file for complete search history.

(56) References Cited

U.S. PATENT DOCUMENTS

2009/0045061 A1* 2/2009 Farrow ................. B82Y 10/00
204/471

FOREIGN PATENT DOCUMENTS

| JP | 2012-141186 | 7/2012 |
|---|---|---|
| KR | 10-2012-0036579 | 4/2012 |
| KR | 10-1172279 | 8/2012 |
| KR | 10-2012-0122402 | 11/2012 |
| KR | 10-2013-0024213 | 3/2013 |
| KR | 10-2013-0035621 | 4/2013 |

(Continued)

OTHER PUBLICATIONS

Woo Soon Jang et al., "Kinetically controlled way to create highly uniform mono-dispersed ZnO sub-microrods for electronics" Journal of Materials Chemistry, 22, p. 20719-20727 (Aug. 2012).

(Continued)

*Primary Examiner* — Thomas Dougherty
*Assistant Examiner* — Karen B Addison

(57) ABSTRACT

A self-powered generator is provided. The generator includes a piezoelectric nanorod member layer that includes a first layer; a second layer; and a plurality of piezoelectric nanorods disposed between the first and second layers. The piezoelectric nanorod is a biaxially-grown nanorod. When mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis.

16 Claims, 21 Drawing Sheets

(56) References Cited

FOREIGN PATENT DOCUMENTS

KR  10-2013-0141901   12/2013
WO     2012/034110    3/2012

OTHER PUBLICATIONS

Tae Il Lee et al., "High-Power Density Piezoelectric Energy Harvesting Using Radially Strained Ultrathin Trigonal Tellurium Nanowire Assembly" Advanced Materials, 25, p. 2920-2925 (Apr. 2013).

* cited by examiner

SELF-POWERED GENERATOR, METHOD OF FABRICATING THE SAME AND PIEZOELECTRIC ENERY-HARVESTING DEVICE USING THE GENERATOR

CROSS REFERENCE TO RELATED APPLICATION

The present application claims priority from Korean Patent Application Number 10-2013-168817 filed on Dec. 31, 2013, the entire contents of which are incorporated herein for all purposes by this reference.

BACKGROUND OF THE INVENTION

Field of the Invention

The present invention relates to a generator, and more particularly, to a self-powered generator which can output power suitable for a predetermined application without a separate external power source.

Description of Related Art

The skin of a living organism of people is filled with sensors designed to perceive various external physical or chemical stimuli and transfer information on the stimuli to the brain such that homeostasis can be maintained. Various sensors that can detect changes in pressure, temperature, light, absorbed chemicals etc. should be integrated into artificial skin that covers a biomimetic robot in order to achieve an auto-feedback function equivalent or superior to that of the living organism. In order to address this requirement, there have been reports on stretchable electronic sensors and electrical wiring embedded into the artificial skin.

Typically, a certain amount of electric energy (electric power) is required to operate an electronic sensor and transfer a signal to a central processing unit (CPU) regardless of the type of the sensor to be used (passive or active). In many sensors, the energy is supplied through long and complicated electric wiring from a separate power source. In this case, however, a considerable amount of joule heat as well as the restriction of sensing areas is unavoidable. One possible solution to this power supply issue can be conceived. This involves self-powered artificial skin (SPAS) without electric wiring, to which sensors can be integrated with high density to closely mimic living skin.

Considering mechanical energy generated from the stretching and bending of the skin, it is desirable to find a method of powering the SPAS based on piezoelectric energy harvesting. Over the past decade, self-powered sensing systems based on piezoelectric nanogenerators (NGs) have been developed for a variety of sensing applications by a number of study groups. However, no NGs suitable for the SPAS that have a high mechanical stretchability, a small thickness, environmental compatibility and a large area have been developed yet.

A method of fabricating a flexible NG was disclosed (e.g. Korean Patent Application Publication No. 10-2012-36579). However, this method requires high-temperature heat treatment of a piezoelectric device layer for crystallization, as well as separate transfer of the piezoelectric device layer to a flexible substrate. This method also discloses the use of perovskite (PZT, $BaTiO_3$). In this case, however, the crystal orientation of a material must be attained through the induction of a high electric field so that ferroelectricity can be used.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a self-powered generator which can output power without a separate external power source and a method of fabricating the same.

Also provided are a self-powered generator which can output power using mechanical energy generated from repetitive movements and a method of fabricating the same.

Also provided are a self-powered generator which is configured such that it can be easily attached to body parts of people, such as the skin or heart, which conduct repetitive muscle movements and can generate power using mechanical energy originating from the muscle movements, and a method of fabricating the same.

Also provided are a self-powered generator such that it can generate power using mechanical energy induced from the outside and be freely applied without being specifically restricted involving the shape or structure of applications and a method of fabricating the same.

Also provided is a piezoelectric energy harvesting device using the above-described self-powered generator.

In an aspect of the present invention, provided is a self-powered generator that includes a piezoelectric nanorod member layer that includes a first layer; a second layer; and a plurality of piezoelectric nanorods disposed between the first and second layers. Each of the plurality of piezoelectric nanorods is a biaxially-grown nanorod. When mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis.

According to an exemplary embodiment of the present invention, the plurality of piezoelectric nanorods may be arrayed unidirectionally between the first and second layers.

The plurality of piezoelectric nanorods may be arrayed such that a longitudinal direction thereof is parallel to a bending direction of the self-powered generator.

The plurality of piezoelectric nanorods may be arrayed unidirectionally to form a single layer between the first and second layers.

The first and second layers may be made of a material that is able to transfer the mechanical energy applied from the outside to the piezoelectric nanorods.

The first and second layers may be made of a material that is able to transfer the piezoelectric potentials generated from the plurality of piezoelectric nanorods to surfaces of the first and second layers.

The first and second layers may be flexible.

The first and second layers may be made of a dielectric material having a dielectric constant.

The first and second layers may be made of polydimethylsiloxane (PDMS).

In the self-powered generator, the piezoelectric nanorod member layer may include a plurality of piezoelectric nanorod member layers which are stacked one on another.

A voltage and current generated from the generator may increase as the number of the piezoelectric nanorod member layers increases.

In another aspect of the present invention, provided is a method of fabricating a self-powered generator. The method includes the following steps of: providing a substrate on which a first layer is stacked; arranging a plurality of biaxially-grown piezoelectric nanorods on the first layer; aligning the plurality of arranged biaxially-grown piezoelectric nanorods in one direction by unidirectional rubbing, thereby forming a single layer of aligned biaxially-grown piezoelectric nanorods; and stacking a second layer on the single layer. When mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis.

According to an exemplary embodiment of the present invention, the plurality of biaxially-grown piezoelectric nanorods may be fabricated by hydrothermal synthesis.

The plurality of biaxially-grown piezoelectric nanorods may be arrayed such that a longitudinal direction thereof is parallel to a bending direction of the self-powered generator.

The plurality of biaxially-grown piezoelectric nanorods may be arrayed unidirectionally to form a single layer between the first and second layers.

The first and second layers may be made of a material that is able to transfer the mechanical energy applied from the outside to the piezoelectric nanorod member layer, is able to transfer piezoelectric potential generated from the plurality of piezoelectric nanorods to surfaces of the first and second layers and is flexible.

The first and second layers may be made of a dielectric material having a dielectric constant, and preferably, polydimethylsiloxane (PDMS).

In a further aspect of the present invention, provided is a piezoelectric energy-harvesting device including a piezoelectric nanorod member layer that includes a first layer; a second layer; and a plurality of piezoelectric nanorods disposed between the first and second layers; and electrode layers formed on surfaces of the first and second layers. Each of the plurality of piezoelectric nanorods is a biaxially-grown nanorod. When mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis According to an exemplary embodiment of the present invention, the plurality of piezoelectric nanorods may be arrayed unidirectionally between the first and second layers.

The plurality of piezoelectric nanorods may be arrayed such that a longitudinal direction thereof is parallel to a bending direction of the self-powered generator.

The plurality of piezoelectric nanorods may be arrayed unidirectionally to form a single layer between the first and second layers.

The piezoelectric energy-harvesting device may include a plurality of the piezoelectric nanorod member layers.

The plurality of piezoelectric nanorod member layers may be connected in series.

The plurality of biaxially grown piezoelectric nanorods may be fabricated by hydrothermal synthesis.

The first and second layers may be made of a material that is able to transfer the mechanical energy applied from the outside to the piezoelectric nanorods, is able to transfer the piezoelectric potential generated from the plurality of piezoelectric nanorods to surfaces of the first and second layers and is flexible.

The first and second layers may be made of a dielectric material having a dielectric constant.

The first and second layers may be made of PDMS.

As set forth above, the self-powered generator has a simple structure, and can be freely used for any applications without being specifically restricted.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

DETAILED DESCRIPTION OF THE INVENTION

Reference will now be made in detail to exemplary embodiments of the present invention, examples of which are illustrated in the accompanying drawings. Herein, detailed descriptions of functions and components well known in the art will be omitted. Even if such descriptions are omitted, the constructions, functions and so on of a self-powered generator according to the present invention will be apparent to a person skilled in the art from the following description.

As described in relation to the related art, the generator applicable to, for example, the skin of people must satisfy several conditions, such as a high mechanical stretchability, a small thickness, environmental compatibility and a large area. In addition, the generator is required to operate without a separate external power source such that it can be used for a variety of applications without specific restrictions.

In order to satisfy such requirements, an aspect of the present invention provides a self-powered generator which includes biaxially-grown ZnO nanorods made of an environment-friendly piezoelectric nanomaterial and has a large fabrication area attributable to dry rubbing. Unlike the previous studies, the self-powered generator according to the present invention has a structure that does not have a separate substrate, is stretchable and bendable, and can be integrated into a variety of forms as required by specific applications.

Figure 3A:
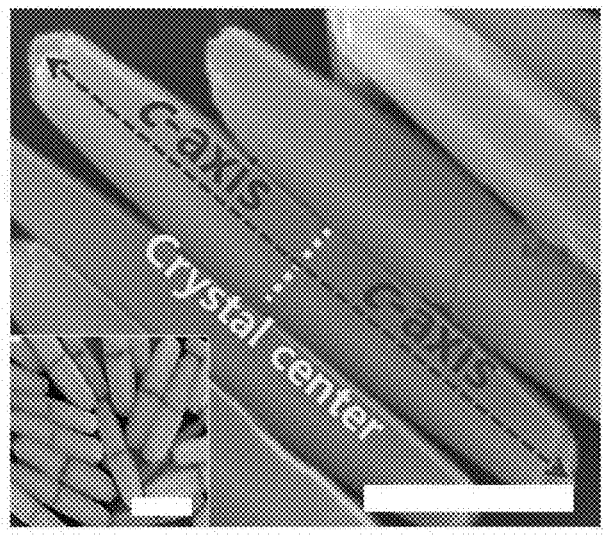
FIG. 3A to 3K are views showing the generation of piezoelectric potential and simulation results of bi-axially grown ZnO nanorods under bending stress.
Figure 3B:
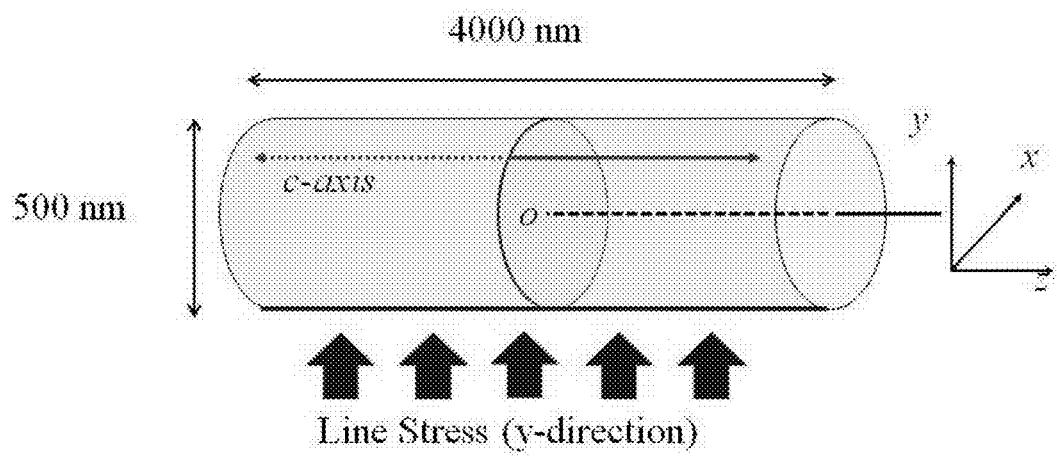
Figure 3C:
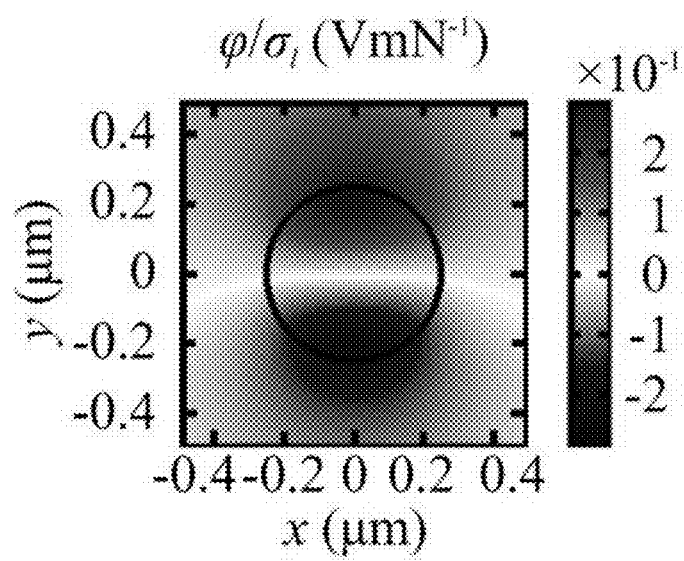
Figure 3D:
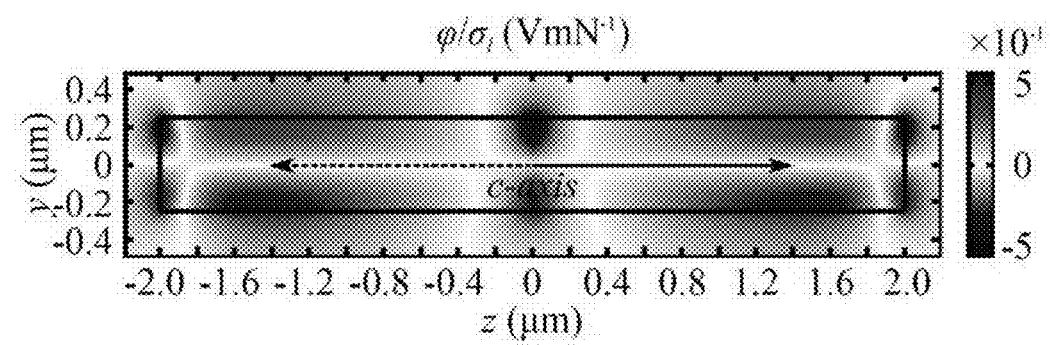
Figure 3E:
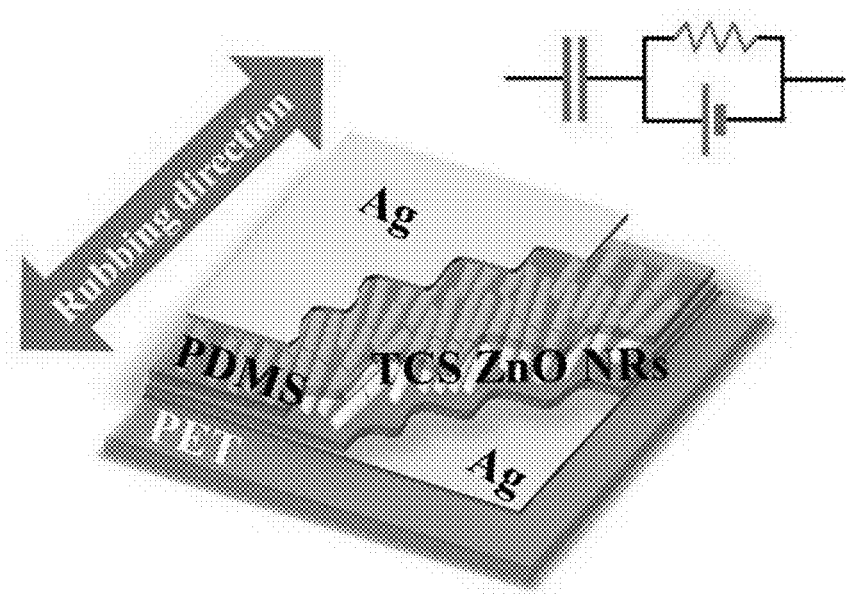

The self-powered generator according to this embodiment has a simple structure compared to the related-art approach, and an example of the structure of the self-powered generator is shown in FIG. 3E. As shown in the figure, the self-powered generator according to this embodiment is configured such that a plurality of nanorods is aligned between polydimethylsiloxane (PDMS) thin films. The nanorods according to this embodiment are implemented as, but not limited to, ZnO nanorods. ZnO is an example of representative piezoelectric materials, and any piezoelectric material that can convert external mechanical force into electric potential is applicable to the present invention. For instance, a variety of other piezoelectric materials, such as ZnO, $ZnSnO_3$, GaN, Te, CdTe, CdSe, $KNbO_3$, $NaNbO_3$, InN, PVDF and PVDF-TrFE, can be used. The term "nanorods" used in the specification and the appended Claims is commonly used by those skilled in the art to which the present invention relates, and the aspect ratio of nanorods is typically 10 or less. In many cases, the size of "nano" is referred to as being 100 nm or less in the art. It should be understood that the term "nanorods" is interpreted as a material, the technical meaning of which is consistent with its meaning in the context of the relevant art. ZnO nanorods used in this embodiment has a length ranging approximately from 2.5 to 3 μm and a diameter ranging approximately from 200 to 250 nm. One-dimensional nano-materials of such a small size are characterized in that a lattice strain can be easily induced by a small amount of external mechanical energy (bending or shaking).

The PDMS serves to firmly support the piezoelectric nanorods between first and second PDMS films. In addition, the PDMS is a dielectric material having a dielectric constant, and is flexible such that it can be attached to any region of a variety of objects, including a living organism of people, such as the skin or the heart, and clothes for people. However, the present invention is not limited to such PDMS materials, but any dielectric material having flexibility and a dielectric constant can be applied to the present invention. Specifically, the present invention can employ any dielectric material that has a dielectric constant and can transfer piezoelectric potential generated from a piezoelectric material. It is more preferable that the dielectric material is flexible so as to be attached to any object and can transfer external mechanical energy to the piezoelectric material without a significant loss. In consideration of such conditions, the PDMS is used in exemplary embodiments of the present invention.

Figure 1:
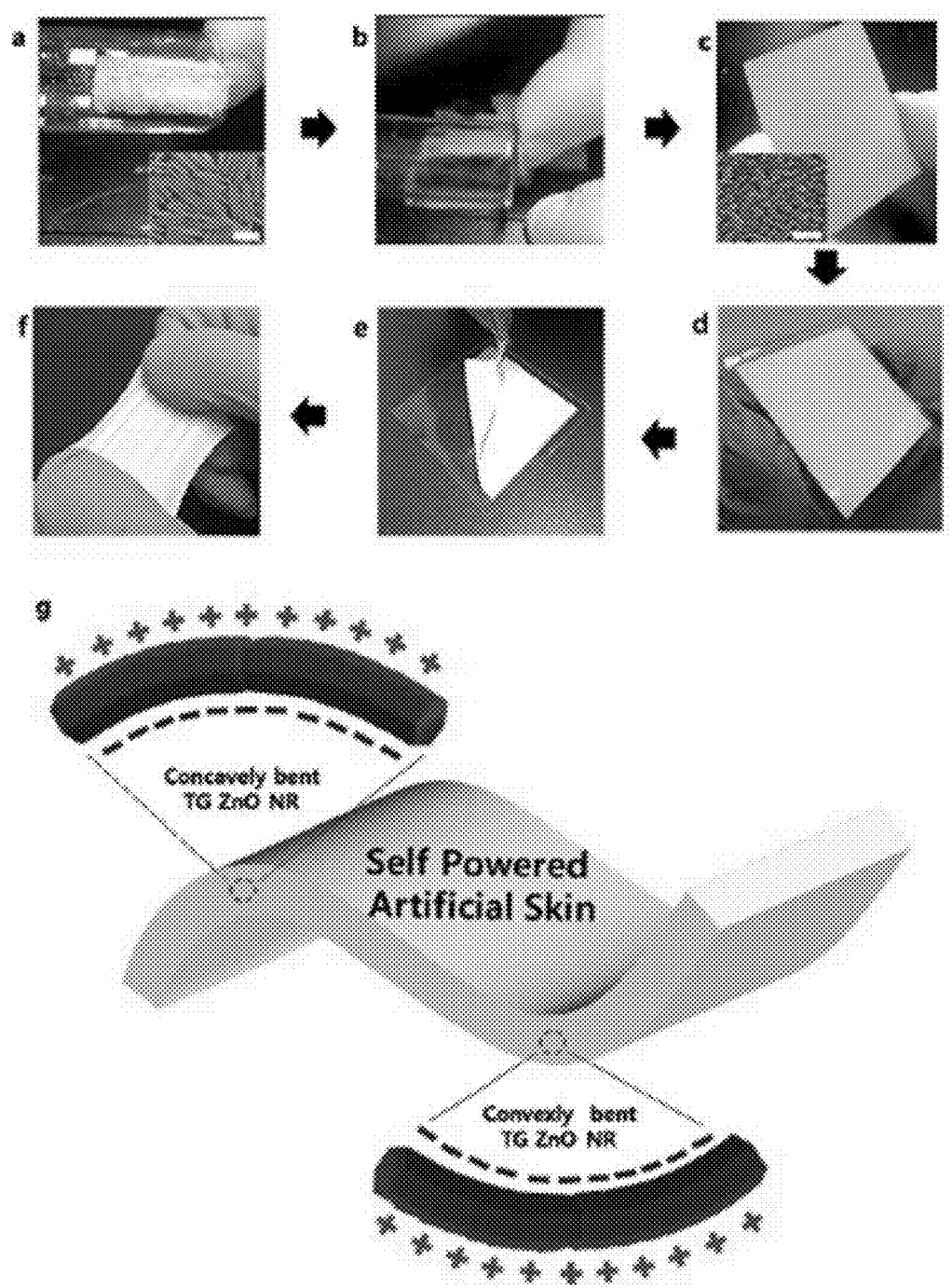
FIG. 1 is a view showing a process for fabricating self-powered artificial skin (SPAS) according to an exemplary embodiment of the present invention.

A description will be give blow of a process for fabricating the self-powered generator with reference to FIG. 1. FIG. 1 schematically shows the process for fabricating the self-powered generator according to an exemplary embodiment of the present invention. The illustration in this figure is an example in which the self-powered generator according to the present invention is applied to self-powered artificial skin (SPAS).

Figure 2:
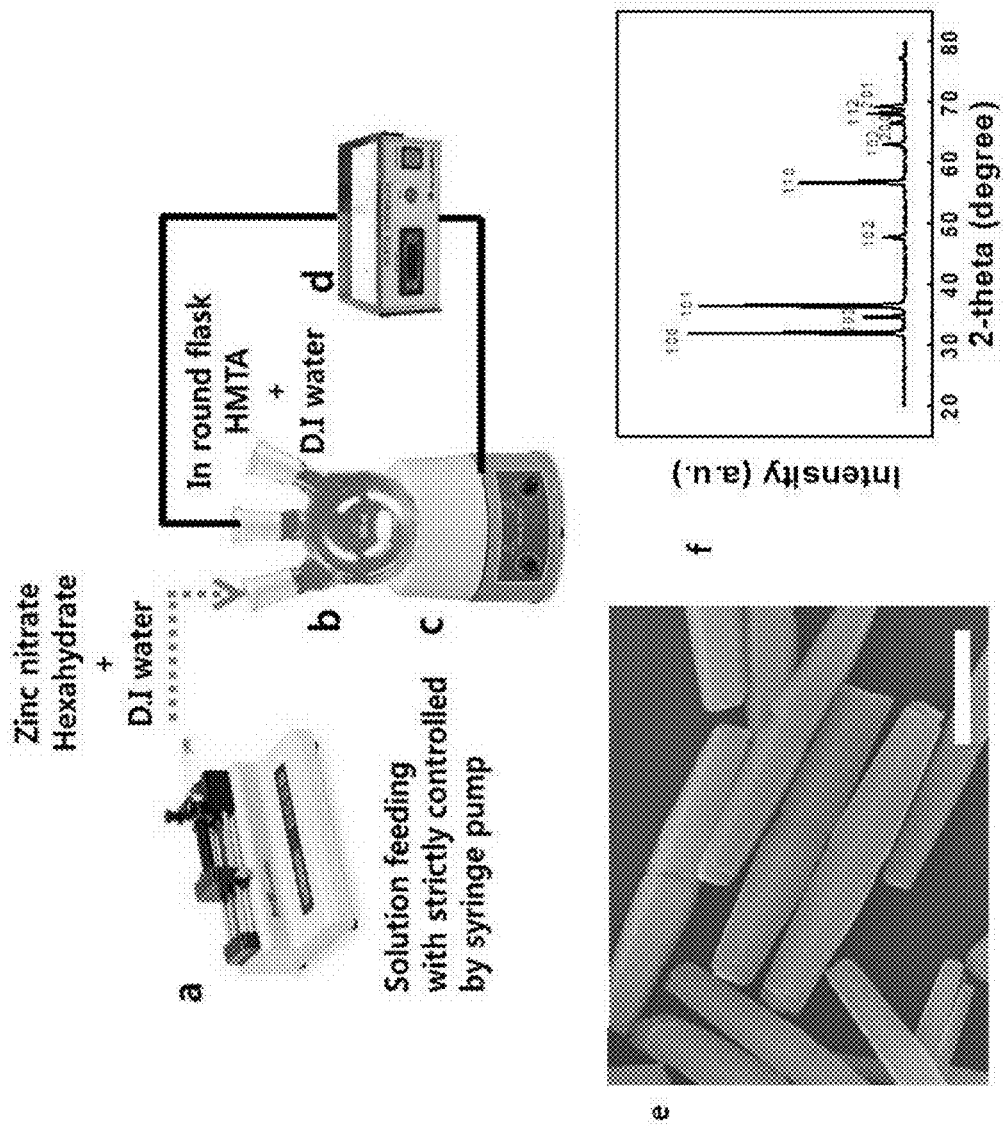
FIG. 2 is a view showing a system for synthesizing bi-axially grown zinc oxide (ZnO) nanorods according to an exemplary embodiment of the present invention.

FIG. 1 is a view showing the process for fabricating the SPAS. First, biaxially-grown ZnO nanorod powders were prepared by hydrothermal synthesis (Woo Soon Jang et. al, Kinetically controlled way to create highly uniform monodispersed ZnO sub-microrods for electronics, J. Mater. Chem., 22, 20719-20727 (2012); The disclosure of which is incorporated herein in its entirety.). A system for synthesizing biaxially-grown ZnO nanorods, a scanning electron microscopy (SEM) image and an X-ray diffraction (XRD) spectrum are schematically shown in FIG. 2. The inserted image in part "a" of FIG. 1 shows biaxially-grown ZnO nanorods produced by hydrothermal synthesis after thermal annealing at 400° C. for 2 hours. According to this embodiment, the schematic process for synthesizing biaxially-grown ZnO nanorods will be discussed separately below.

A piece of velvet cloth to which the powders are to adhere was prepared, and PDMS (a matrix material for the SPAS) was stacked on a glass substrate, as shown in part "b" in FIG. 1. Part "b" of FIG. 1 shows unidirectional rubbing technique using the velvet cloth on the PDMS, with which a single layer consisting of biaxially-grown ZnO nanorods aligned in the direction of rubbing was formed within several seconds, as shown in part "c" of FIG. 1. The inserted image in part "c" of FIG. 1 shows a nematic alignment of biaxially-grown ZnO nanorods, and arrows indicate the direction of rubbing. During the rubbing process, biaxially-grown ZnO nanorods having six non-polar prismatic sides were detached from the velvet cloth and affixed to the hydrophobic surface of the PDMS along the in-plane direction until the entire surface of the PDMS was covered with biaxially-grown ZnO nanorods. As a result of strong Van der Waals force, biaxially-grown ZnO nanorods were firmly affixed to the PDMS despite mechanical sweeping by the velvet cloth. (Nanorods that are randomly aligned rotate in order to maintain minimum energy in the direction of rubbing.) A single layer of biaxially-grown ZnO nanorods on the glass substrate coated with the PDMS is shown in part "c" of FIG. 1. Finally, in order to fixedly embed biaxially-grown ZnO nanorods in the first PDMS area, the single layer was coated with another PDMS layer, thereby completing an SPAS of a single layer.

By repeating this process several times, the SPAS consisting of a plurality of layers was produced, and the SPAS of seven layers is shown in part "d" of FIG. 1. The reason for varying the number of layers of biaxially-grown ZnO nanorods is to modulate the output power of the SPAS so that the output power matches the amount of electrical energy required for any give application. It should be understood that the self-powered generator according to the present invention is not necessarily implemented as the SPAS of a plurality of layers but can be implemented as an SPAS of a single layer. In order to demonstrate the utility of the above-fabricated SPAS as stretchable and bendable artificial skin, the SPAS including seven layers of biaxially-grown ZnO nanorods was detached from the glass substrate. The stretchability of the SPAS was tested, and high stretchability was identified, as shown in parts "e" and "f" of FIG. 1. The inventors designed the SPAS so as to be piezoelectrically activated according to inflection polarity due to mechanical deformation. As shown in part "g" of FIG. 1, biaxially-grown ZnO nanorods in the PDMS were altered either convexly or concavely. Bent biaxially-grown ZnO nanorods received transverse shear stress-strain, and both positive and negative piezoelectric potentials occurred in the transversal direction.

Piezoelectric Behaviors of Biaxially-Grown ZnO Nanorods

In order to mimic the mechanical deformation of thin skin of the surface of a living organism, the inventors studied the SPAS when bent on a thick substrate. When the SPAS is bent, the PDMS matrix experiences transverse shear stress-strain and longitudinal tensile or compressive stress-strain (where the transverse direction is referred to as a direction in which the direction of alignment of nanorods is equal to the direction of bending, and longitudinal direction is referred to as a direction in which the direction of alignment of nanorods is perpendicular to the direction of bending.)

Figure 4A:
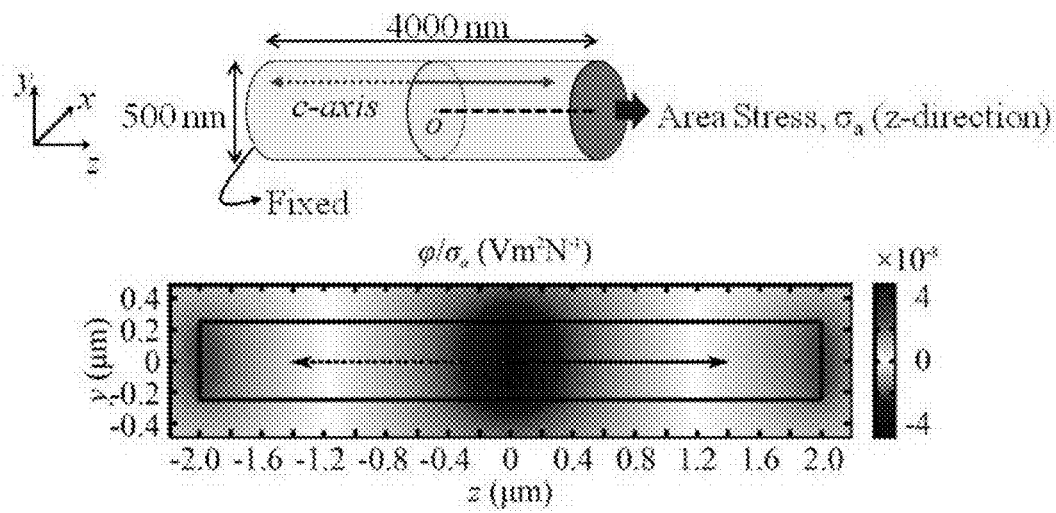
FIGS. 4A and 4B are views showing simulation results of piezoelectric potential in response to the application of tensile stress in the longitudinal direction of ZnO nanorods.
Figure 4B:
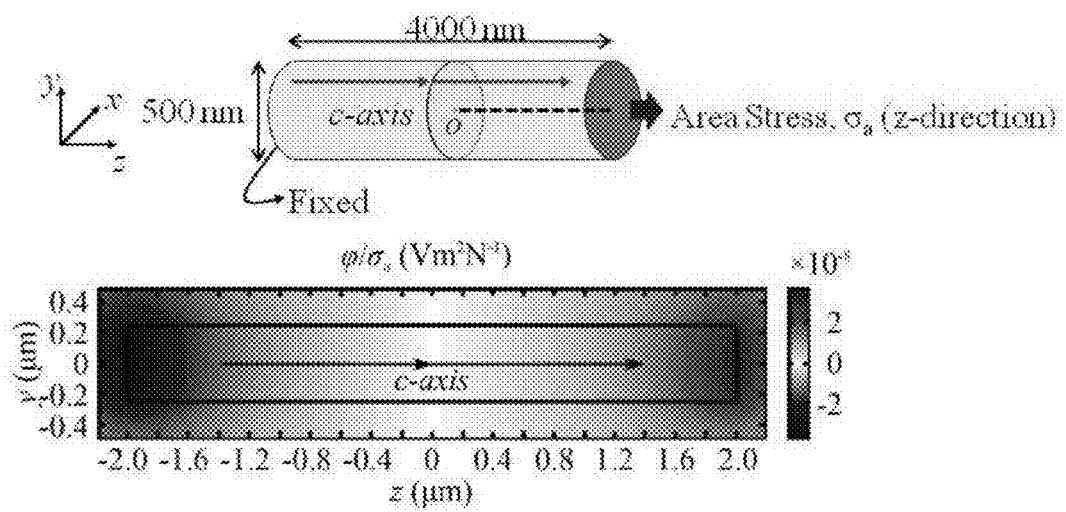

Transversely-arrayed biaxially-grown ZnO nanorods also experience the same mechanical deformation. Theoretically, the tensile or compressive stress on the c-axis of ZnO nanorods does not generate piezoelectric polarization along the transversal direction. Instead, piezoelectric polarization is generated along the longitudinal direction, as shown in FIG. 4 that shows simulation results of piezoelectric potential in response to the application of tensile stress in the longitudinal direction of ZnO nanorods. Therefore, bending along the longitudinal direction of nanorods is more effective. For reference, FIG. 4A shows that two opposite piezoelectric polarizations are generated only along the longitudinal direction of the biaxially-grown ZnO nanorod and FIG. 4B shows that single piezoelectric polarization is generated only along the longitudinal direction of the uniaxially-grown ZnO nanorod.

The inventors theoretically examined how biaxially-grown ZnO nanorods shown in FIG. 3A convert applied mechanical energy into electrical energy. FIG. 3A is an SEM image of biaxially-grown ZnO nanorods that were grown for 30 minutes at 85° C. by hydrothermal synthesis. Arrows and a dotted line indicate the direction of growth (c-axis) and the center of crystal (scale bar=1 μm). The inserted image shows biaxially-grown ZnO nanorods that were grown for 5 minutes at 85° C., and the crystal center is clearly shown (scale bar=500 nm). In the bent matrix, each of embedded biaxially-grown ZnO nanorods aligned along the in-plane direction is symmetrically bent about the middle portion of the nanorod, and thus the symmetric bending can be considered in theoretical calculations. As shown in FIG. 3B that is a schematic view showing biaxially-grown ZnO nanorod, in which Cartesian coordinates are shown (O indicates the center of a vertical plane that bisects a cylinder.). Biaxially-grown ZnO nanorod can be assumed to be a cylinder having the following parameters: (1) the diameter and length of the cylinder are 500 nm and 4000 nm, respectively, (the cylinder is also referred to as the sub-micron rod for the sake of convenience) (2) the c-axis parallel to the center-axis (which is parallel to the z-axis) of the cylinder is mirror-symmetrically aligned by the xy-plane that halves the cylinder, (3) mechanical stress and piezoelectricity linearly increase in response to external strain, (4) the elastic modulus, piezoelectric coefficient, and relative permittivity of ZnO are known (e.g. can be taken from known literatures), (5) the sign of the piezoelectric coefficient is plus (or minus) for the ZnO domain where the orientation of c-axis is in the positive or negative z-direction, and (6) the cylinder is surrounded by a dielectric material having a relative permittivity of 2.3, which is considered to be PDMS.

Figure 5A:
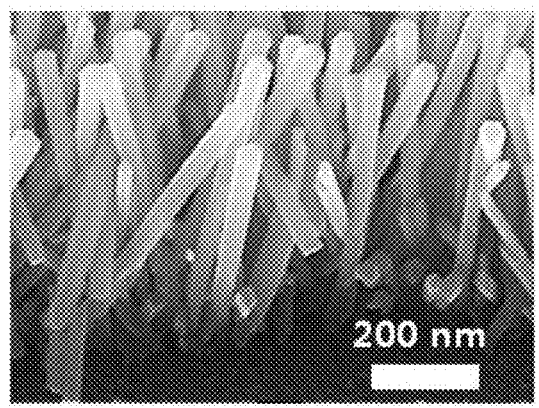
FIGS. 5A and 5C are views showing ZnO nanorods that are uniaxially grown on a seed layer and a simulation result of piezoelectric potential.
Figure 5B:
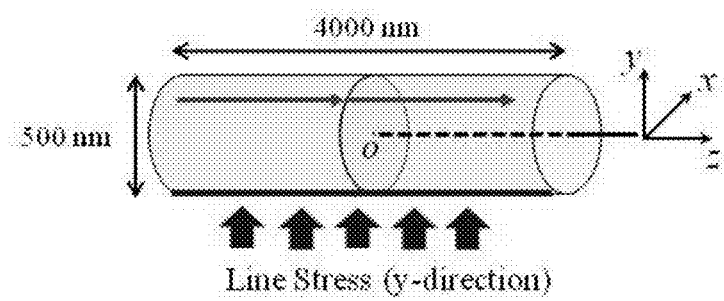
Figure 5C:
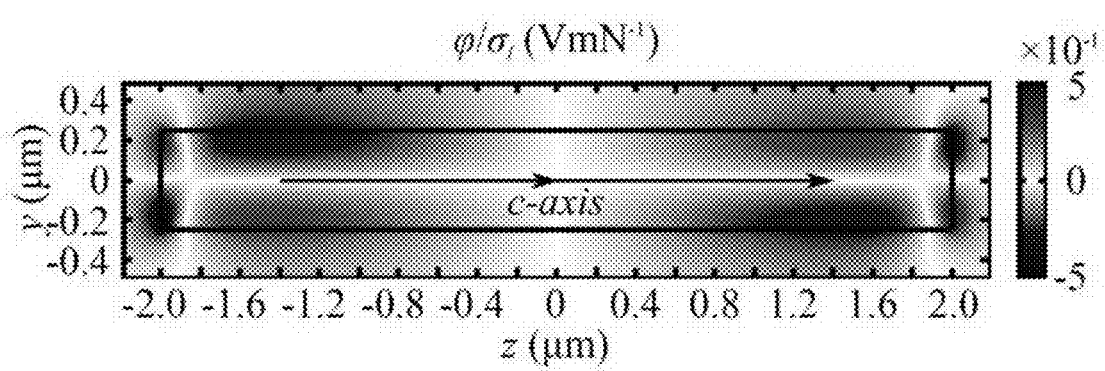

FIGS. 3c and 3d show the calculated distribution of piezoelectric potential in the biaxially-grown ZnO cylinder when a mechanical load of the y-direction is applied to the line boundary of the cylinder at y=−250 nm and x=0 nm. In FIG. 3B, the piezoelectric potential ($\varphi$) corresponding to the biaxially-grown ZnO cylinder under the external line stress ($\sigma_h$) which is indicated with blue arrows. In FIG. 3D, black arrows and solid lines indicate the direction of the c-axis and the ZnO cylinder boundaries, respectively. The calculation was conducted using a finite element method. A majority of the region at the upper half (y>0) of the cylinder exhibits positively polarized piezoelectric potentials, whereas negatively polarized piezoelectric potentials are displayed in the lower half. This distribution of polarization is reversed near the xy-plane that bisects the cylinder. However, the net piezoelectric potential of the upper (or lower) half of the cylinder is a meaningful positive (or negative) value, which allows the device to harvest electrical charges at both electrodes. In contrast, a ZnO cylinder that is unidirectionally grown along the c-axis exhibits vastly different piezoelectricity, compared to the biaxially-grown ZnO cylinder. When the uniaxially grown ZnO cylinder is under the same stress, the net potential of the upper (or lower) half of the ZnO cylinder nearly becomes null, as shown in FIG. 5. FIG. 5 shows ZnO nanorods that are uniaxially grown on a seed layer and a simulation result of piezoelectric potential. Part "a" of FIG. 5 is an SEM image of ZnO nanorods grown on a seed layer, in which ZnO nanorods have only one preferential growth direction. Part "b" of FIG. 5 is a schematic view showing one of uniaxially-grown ZnO nanorods, like FIG. 3B. In part "b" of FIG. 5, the orientation of the c-axis of ZnO in each domain of the cylinder is drawn with a solid arrow. Cartesian coordinates are also shown, and "O" indicates the center of the vertical plane that bisects the cylinder. Part "c" of FIG. 5 shows the piezoelectric potential of each ZnO cylinder, with the c-axis being unidirectionally aligned under the equal stress. Unlike FIG. 3, in each of the upper half and the lower half, opposite polarities are exhibited, and thus there are substantially no piezoelectric potential. In addition, the case shown in FIG. 3 is laterally symmetrical about the center of the cylinder, and thus potential is generated in the vertical direction. In contrast, the case shown in FIG. 5 is laterally asymmetrical. When potentials are measured in the vertical direction, there are substantially no piezoelectric potential since generated potentials are offset each other. These results indicate that a significant piezoelectric voltage of the generator according to the present invention comes from the uniqueness of the bilaterally oriented c-axis of biaxially-grown ZnO nanorods.

In order to experimentally verify the calculated results, a simple piezoelectric energy-harvesting devices was fabricated. A schematic circuit diagram of the piezoelectric energy-harvesting device is shown in FIG. 3E. A single layer of SPAS of which the top and the bottom were coated with silver (Ag) electrodes was placed on a polyethylene terephthalate (PET) substrate. All such devices were operated with a 1 mm bending radius at 0.05 Hz.

Figure 3F:
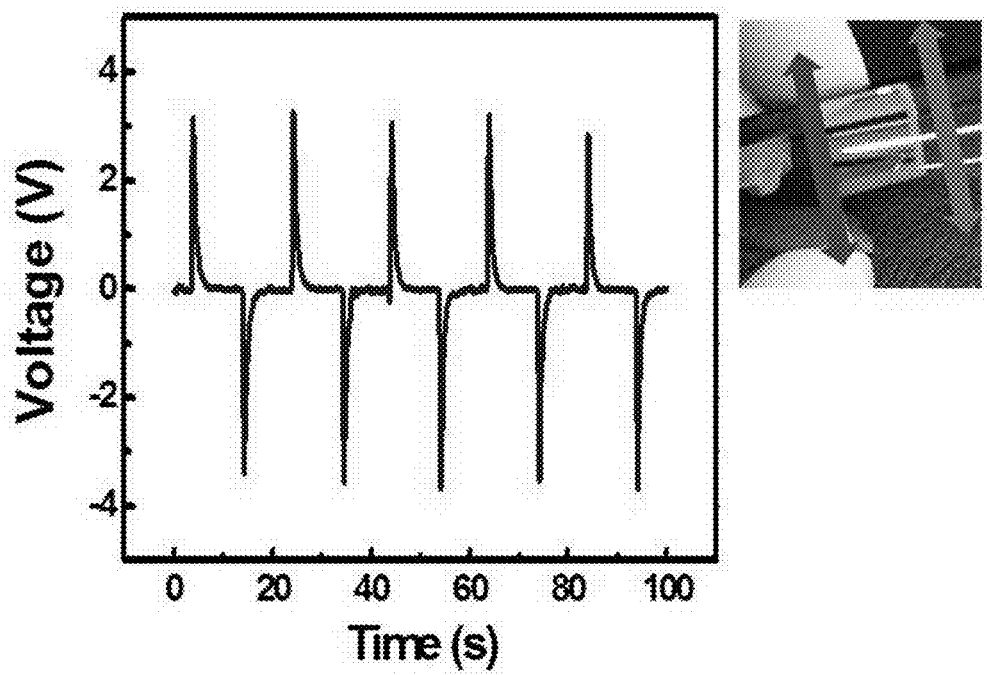
Figure 3G:
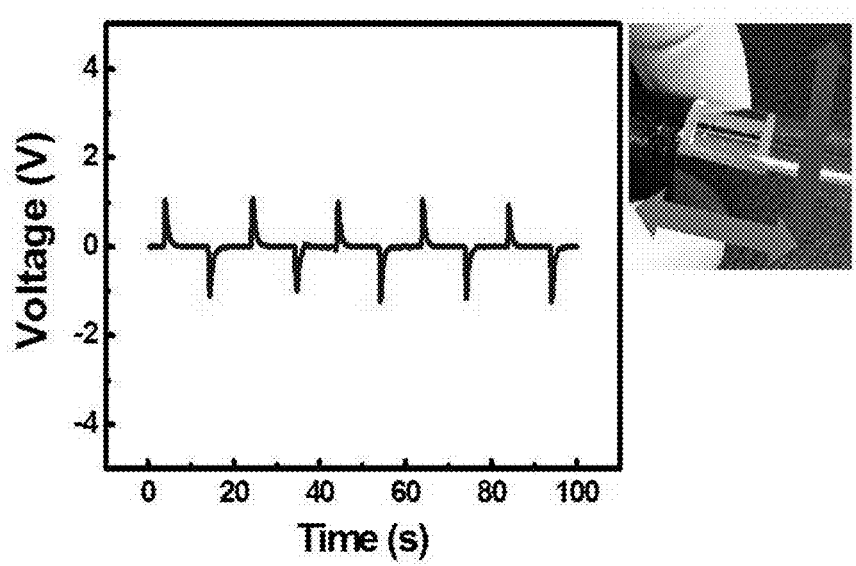

When the bending direction was changed, different voltage outputs were obtained, as shown in of FIGS. 3f and 3g. As shown in FIG. 3F, biaxially-grown ZnO nanorods piezoelectrically activated when they were aligned parallel in the bending direction. The voltage of the parallel bending was at least three times that of the perpendicular bending shown in FIG. 3G. Ideally, a voltage is not always produced through the perpendicular bending, but an output of about 1 V was measured. This voltage is thought to arise from the imperfect alignment of biaxially-grown ZnO nanorods in a particular direction. Therefore, it is preferable that nanorods be designed to align according to specific applications. This is because the efficiency of the generator is important regarding the characteristics of the generator.

Figure 3H:
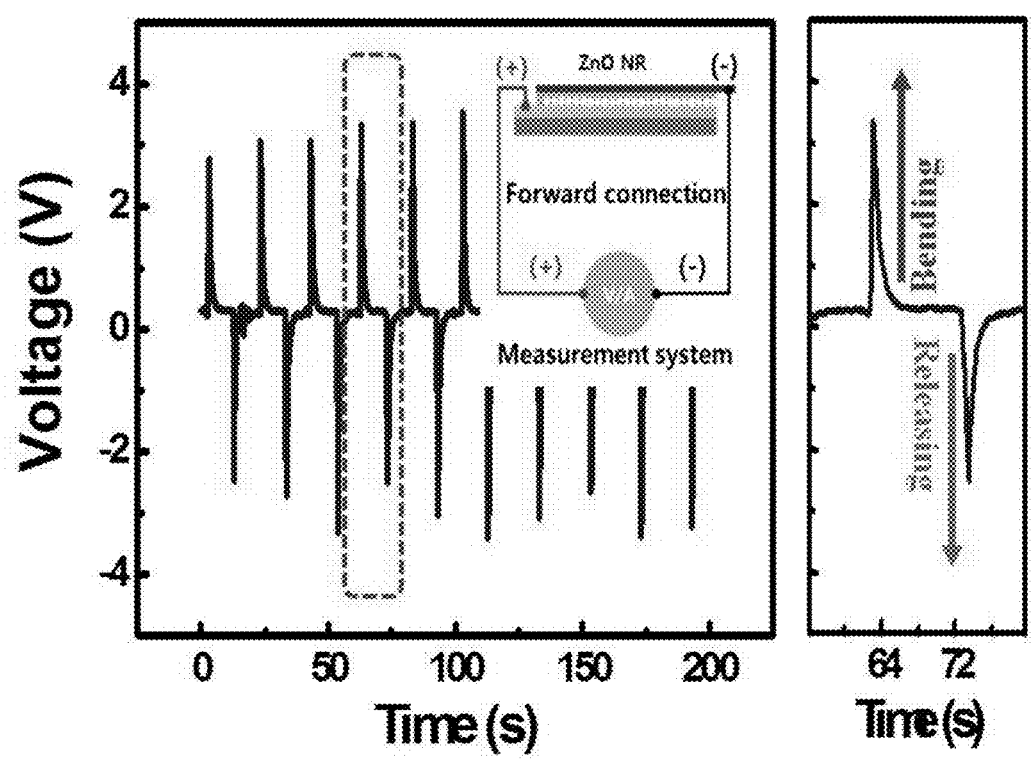
Figure 3I:
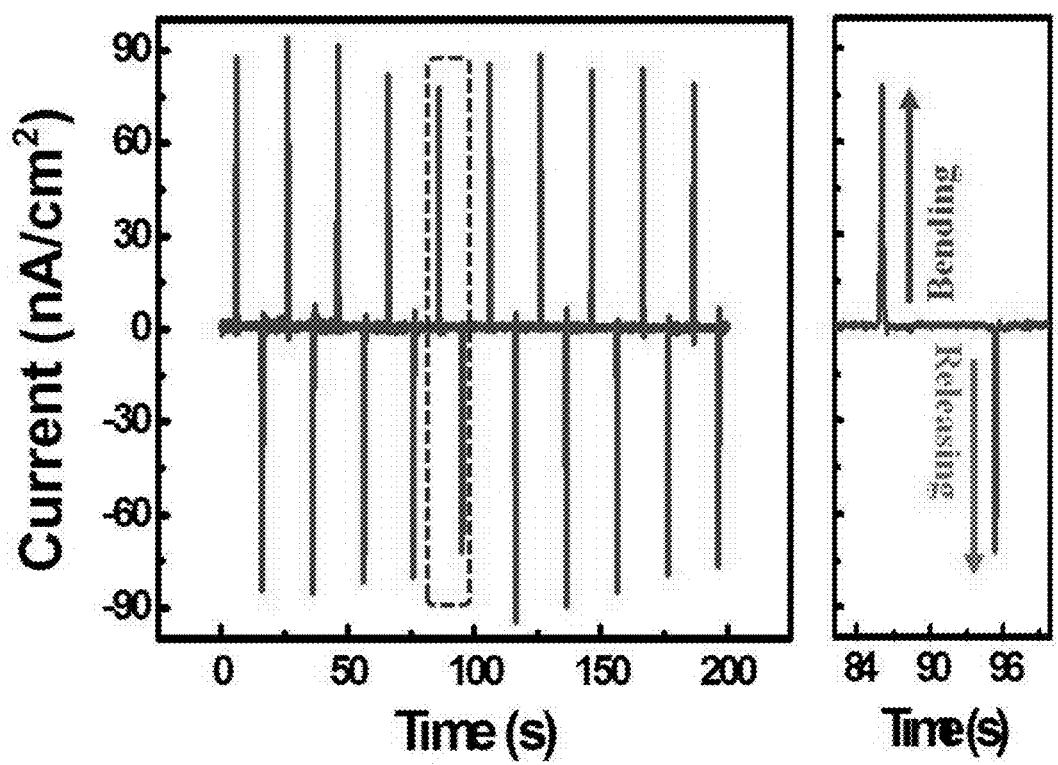
Figure 3J:
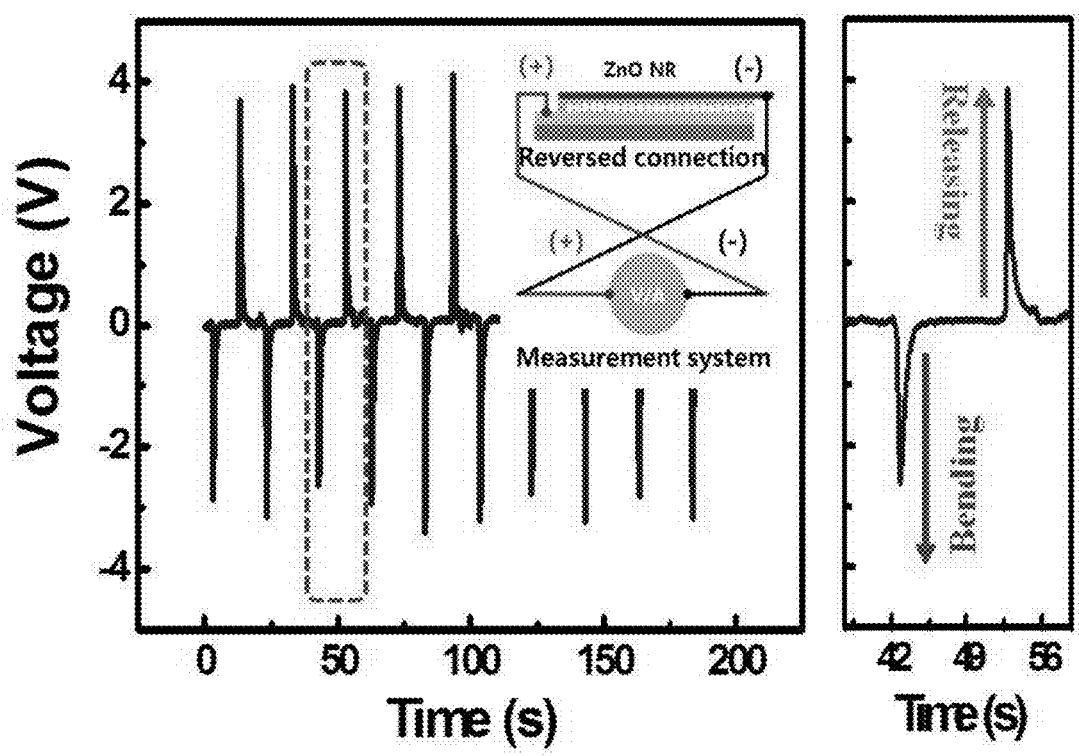
Figure 3K:
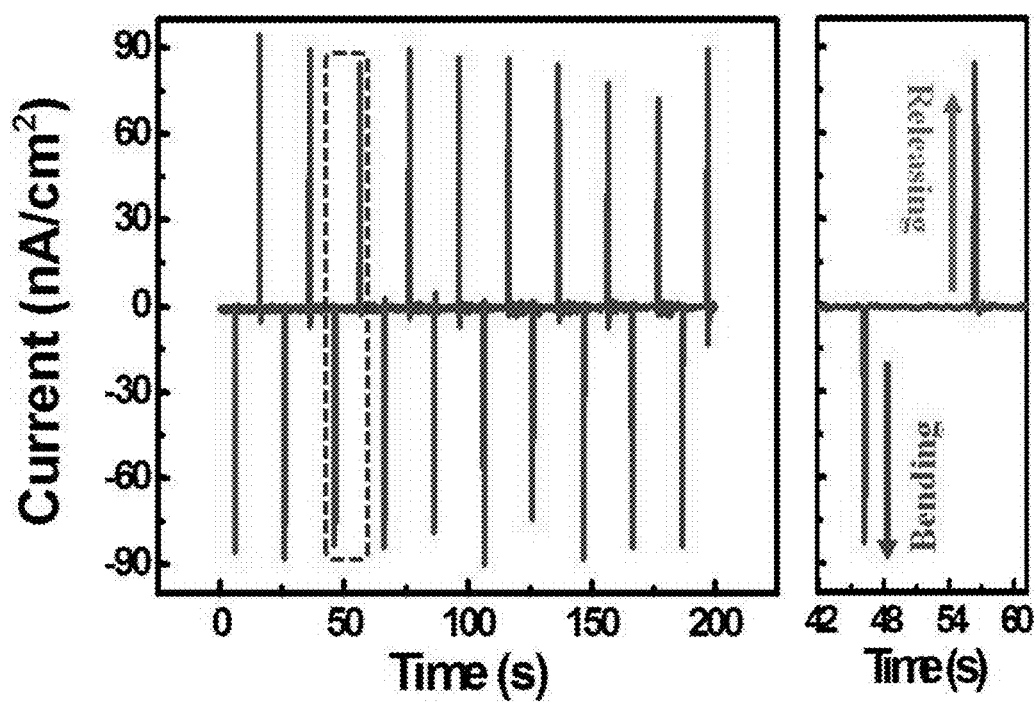

In addition, the polarity of piezoelectric potential generated by the SPAS was determined by a reverse connecting method, as shown in FIGS. 3h to 3k. As the device was bent convexly, a positive voltage and current was initially measured at the top electrode, as shown in FIGS. 3h and 3i. This result coincides perfectly with the calculated prediction. When the direction of the electrical connection was reversed, the polarity of a voltage and current at the top electrode was measured to be negative, as shown in of FIGS. 3j and 3k. Therefore, it is possible to prove that an electrical energy output from the bent SPAS originates from piezoelectrically-activated biaxially-grown ZnO nanorods which were assembled into an in-plane single layer.

Power Modulating Strategies

Figure 6A:
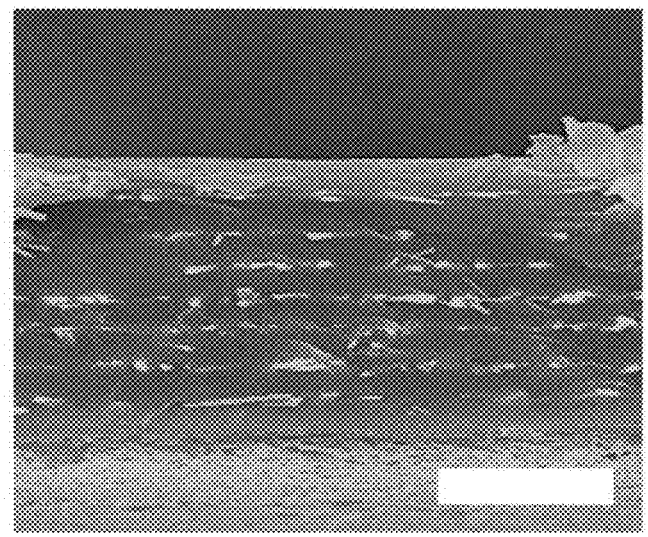
FIG. 6A to 6D are views showing a strategy for modulating the output power of SPAS.
Figure 6B:
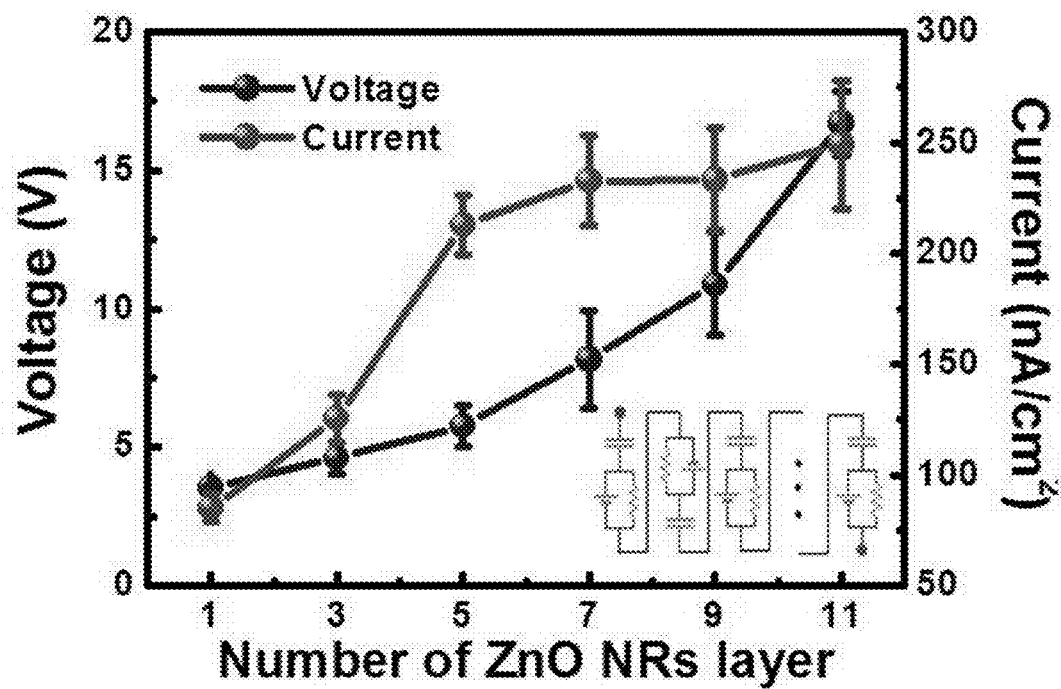

An important characteristic for the SPAS is to modulate output power so as to match power required for a sensor. One strategy for modulating the power of the SPAS is to stack single layers of piezoelectric biaxially-grown ZnO nanorods in a series, as shown in FIG. 6A. FIGS. 6A to 6D show an aspect of modulating the output power of the SPAS through a series connection (FIG. 6A) and a parallel connection (part FIG. 6C). FIG. 6A is a cross-sectional SEM image of SPAS having seven layers of biaxially-grown ZnO nanorods (scale bar=20 μm). In FIG. 6A, the seven single layers of biaxially-grown ZnO nanorods inserted into the PDMS layers can be clearly identified. FIG. 6B shows an output voltage and current increasing with the addition of single layers of biaxially-grown ZnO nanorods. Considering the series-connected equivalent circuit shown as the inserted graph in FIG. 6B, it seems that the tendency of the output voltage is reasonable but the output current is abnormal, judging by the resultant capacitance. The linear accumulation of the piezoelectric potential is represented by an output voltage that linearly increases with respect to the single layers of biaxially-grown ZnO nanorods that are stacked one on another. However, the output current cannot be theoretically increased with the stacking of the piezoelectric active layers in series since the charge density accumulated on each active layer must be kept constant. In the present invention, it seems that the output current is increased since the degree of bending of the device may vary during bending.

Figure 6C:
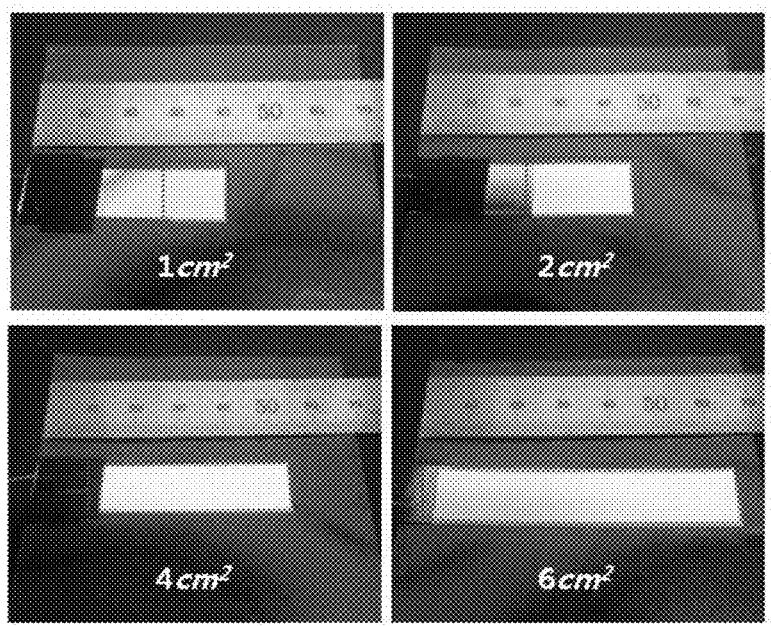
Figure 6D:
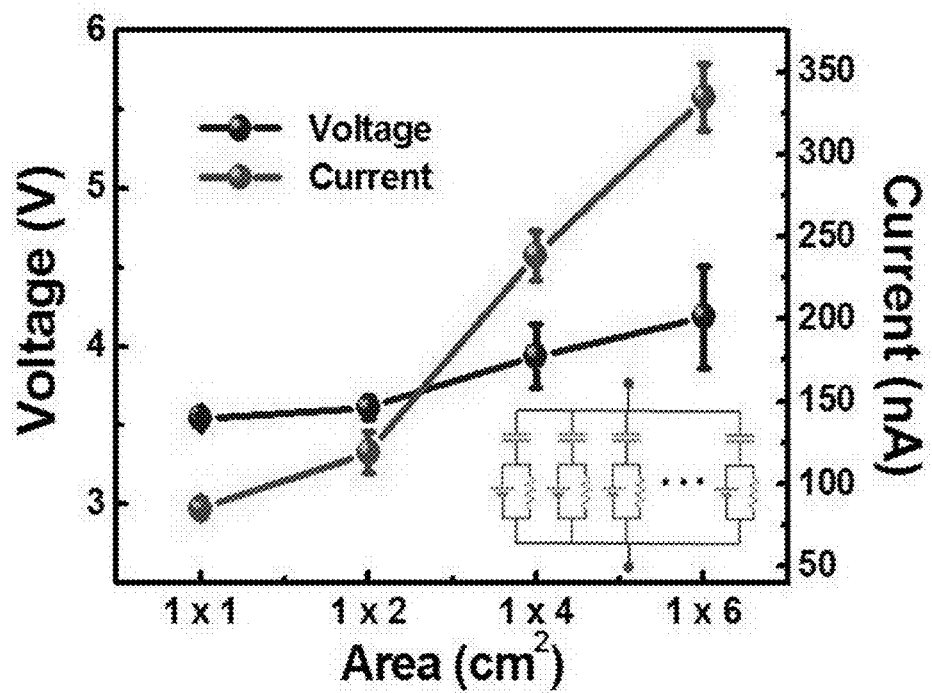

Another strategy for modulating the output voltage of the SPAS is to enlarge the active area of the parallel layers of piezoelectric biaxially-grown ZnO nanorods, as shown in FIG. 6C. In FIG. 6C, the bent area is linearly increased from 1 to 6 cm$^2$. FIG. 6D shows that the output current was increased in proportion to the area of the single layer of biaxially-grown ZnO nanorods but the output voltage were nearly unchanged. Considering the total capacitance based on the equivalent circuit of the parallel connection (see the inserted graph in FIG. 6D), it seems that the tendencies of the output voltage and current were reasonable.

Programmable Integration

In order to achieve an output voltage and current as required, 12 pieces of SPAS were subjected to programmable integration, as shown in FIG. 7. As shown in FIG. 7A, a single layer of SPAS was fabricated on a glass substrate, and an Ag electrode was deposited on the SPAS single layer. The resultant material was split into 72 pieces of SPAS (each SPAS piece having an area of 16 mm$^2$) (i), and was detached from the glass substrate for the purpose of programmable integration, as shown in part "ii" of FIG. 7A. As shown in parts "iii" and "iv" of FIG. 7A, on the previously designed bottom electrodes, individual SPAS pieces were integrated into 3×4 arrays, which were completed after Ag wires were soldered to measure output power. FIG. 7B shows three columns marked with A, B and C and four rows marked with 1, 2, 3 and 4. The bending test was performed in the direction of the four rows.

Figure 7A:
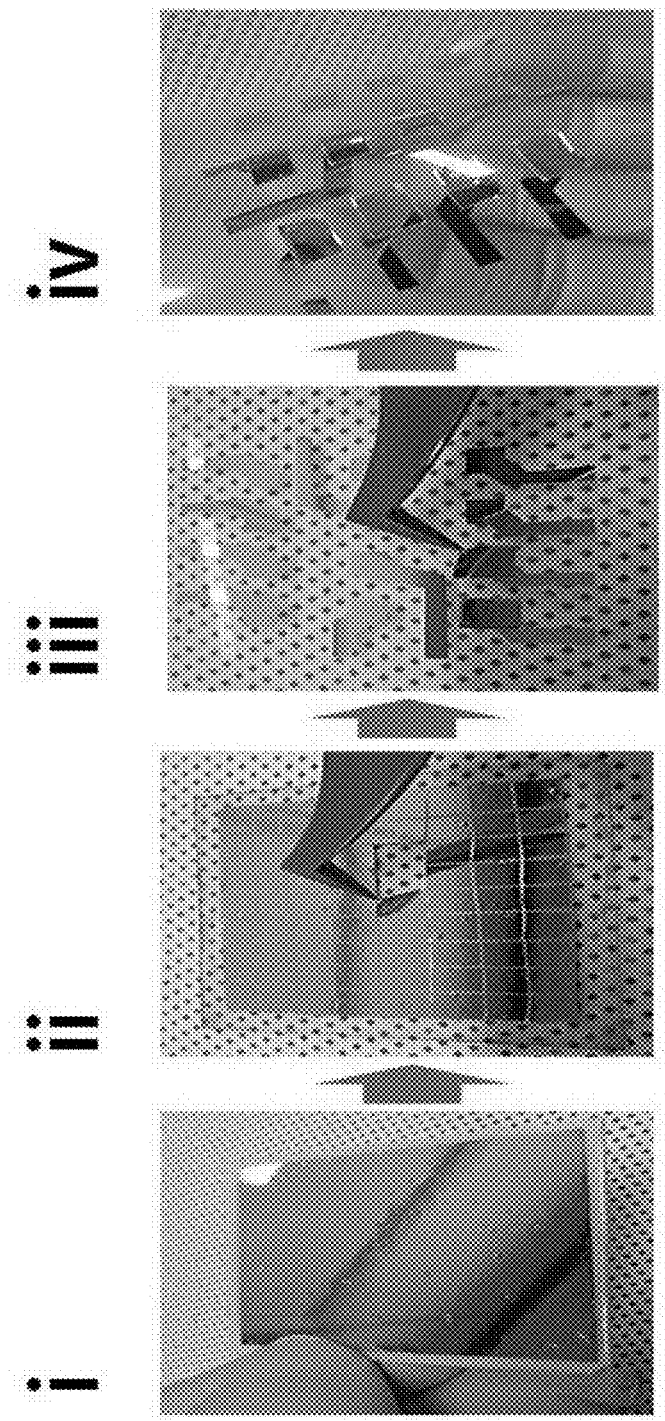
FIG. 7A to 7F are views showing an aspect in which SPAS is integrated according to a specific application and results of an output voltage and current obtained by applying the SPAS to human fingers.
Figure 7B:
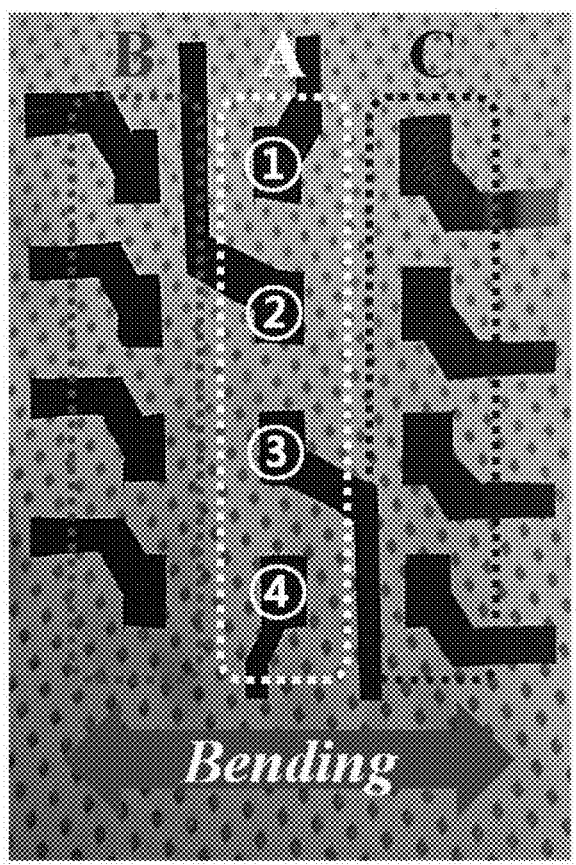
Figure 7C:
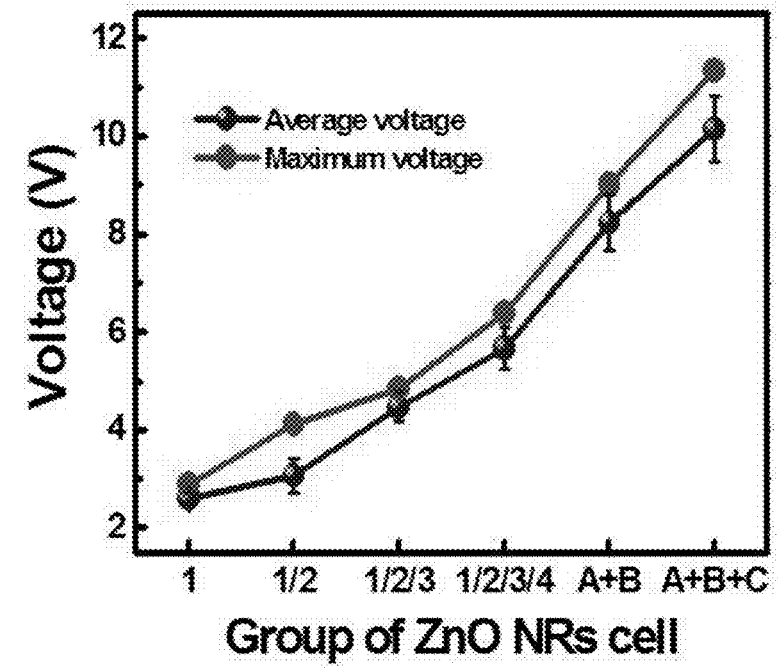
Figure 7C:
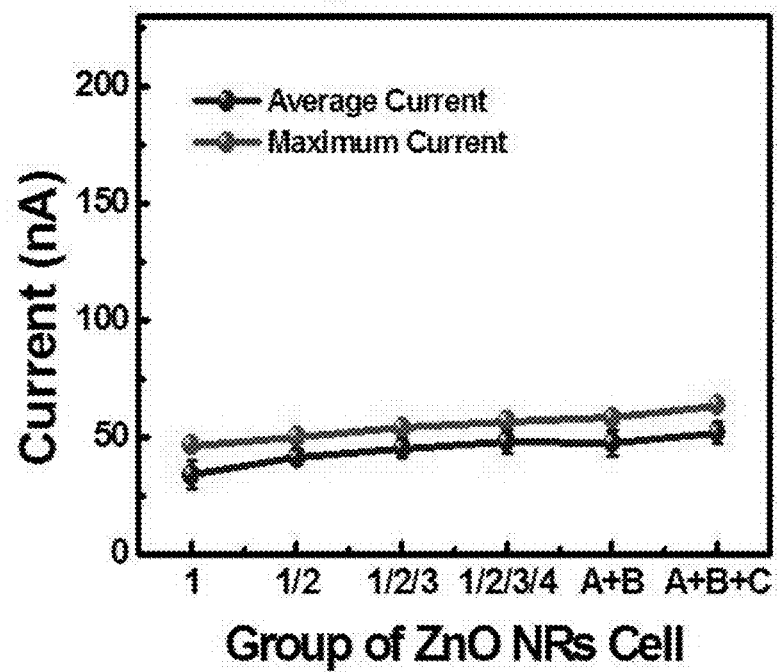
Figure 7D:
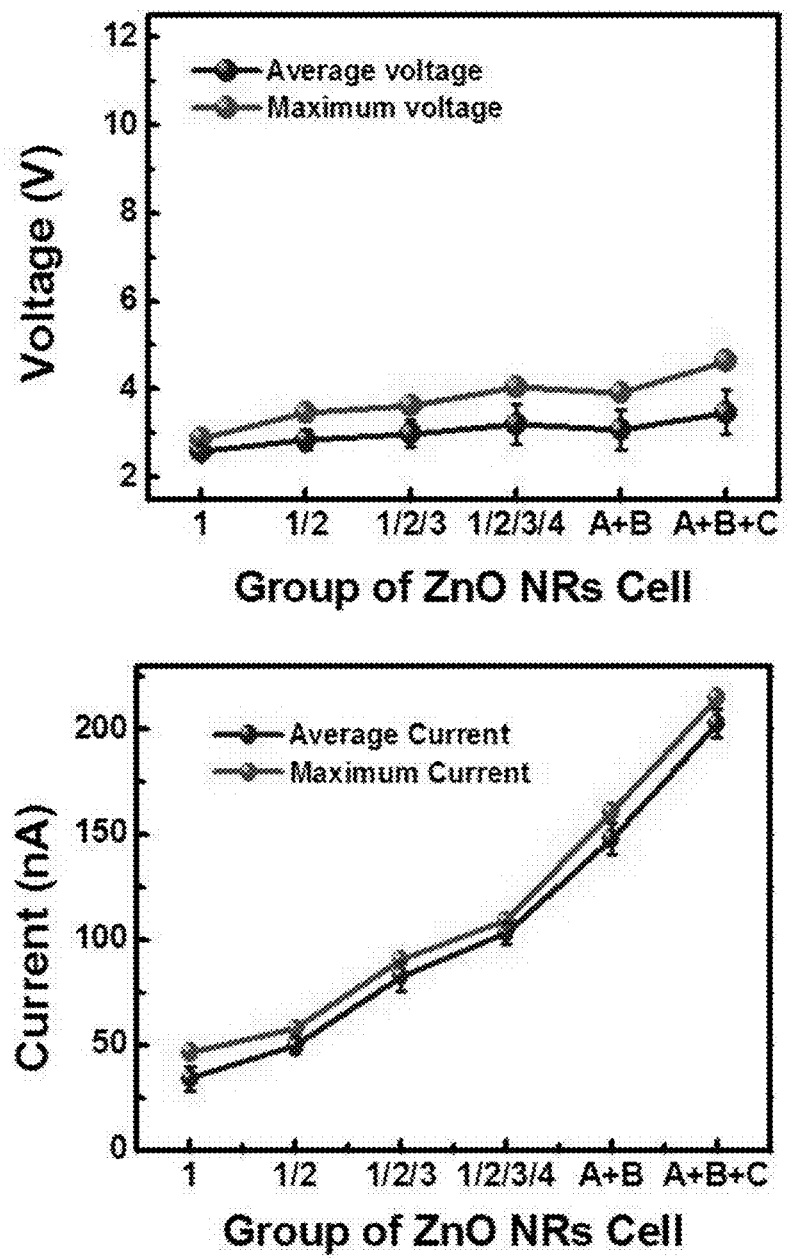

For series connection with each of the SPAS pieces, the output voltage was modulated to be about 0.63 V per each SPAS piece (16 mm$^2$) while the current was maintained the same, as shown in FIG. 7C. Alternatively, the output current of the parallel connection can be modulated by approximately 33 nA per each SPAS piece (16 mm$^2$) while the output voltage was maintained the same, as shown in FIG. 7D. If an n number of series connections and a 12−n number of parallel connections are combined together, a voltage of (2.5+0.63×(11−n)) V and a current of (50+33×(n−1)) nA can be generated. A total of twelve combinations of voltage and current is possible. In addition, the area of one SPAS piece can be varied in order to further modulate the output power. Therefore, the voltage and current required for a sensor can be satisfied with the programmable integration of SPAS samples as described above.

Figure 7E:
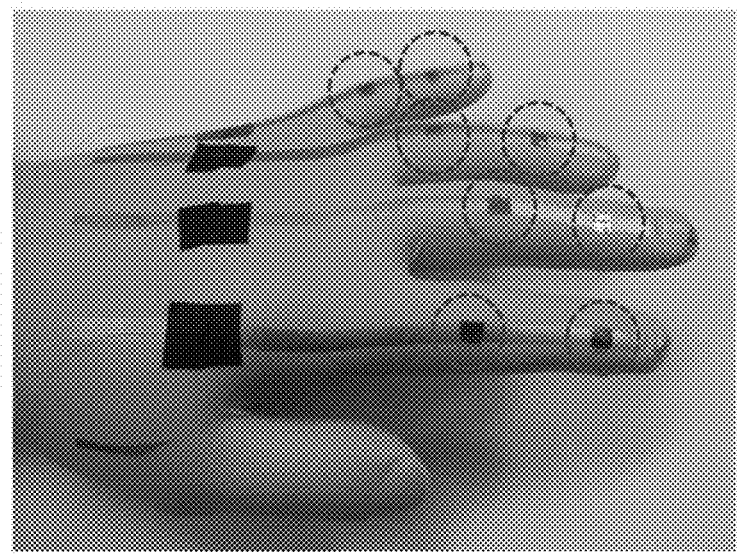
Figure 7E:
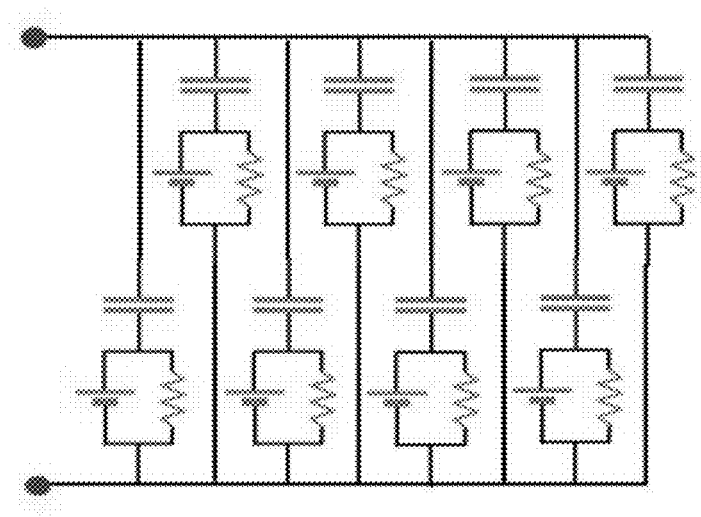
Figure 7F:
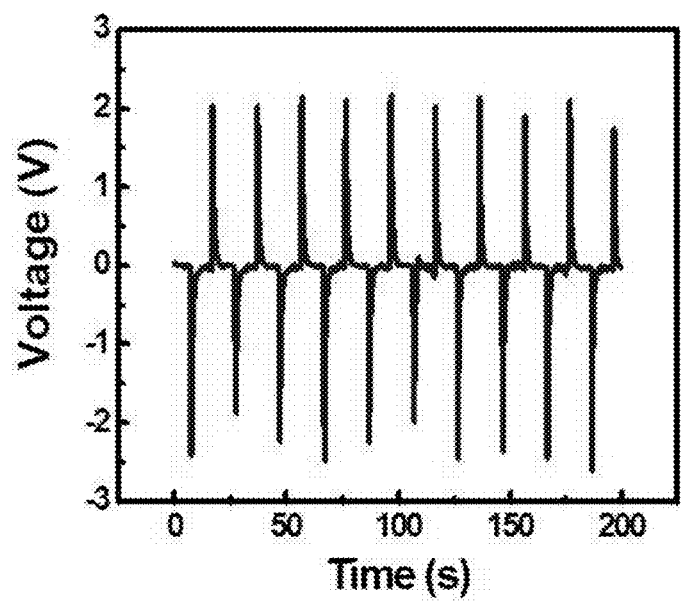
Figure 7F:
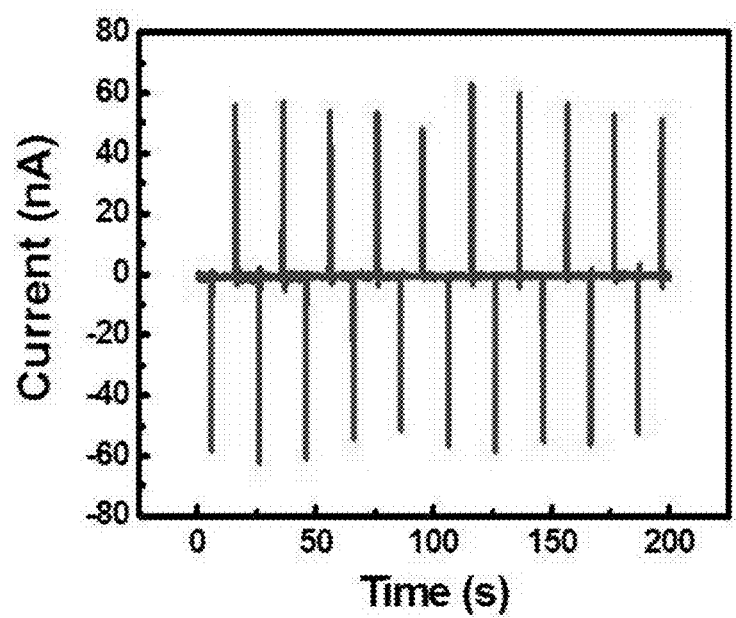

Finally, eight SPAS pieces were integrated to convexly-bent positions on four human fingers wearing a nitrile rubber glove and bottom electrodes were provided at those positions in order to demonstrate practical applicability to living skin, as shown in 7e. An equivalent circuit diagram is also shown in FIG. 7E. After Ag wires were soldered at respective positions, an output voltage and current was measured while the first was being repeatedly closed and opened. The results of the output voltage and current are shown in FIG. 7F. Values of 2 V and 60 nA were obtained from the bending motion of the fingers.

As described above, the SPAS including biaxially-grown ZnO nanorods which are fabricated using the rapid dry rubbing process can be used as a power source of a sensor embedded in the artificial skin. The mechanism related to the in-plane mode of the piezoelectric action of bent biaxially-grown ZnO nanorods was investigated by theoretical calculation, and the output voltage and current was verified through various experimental measurements from the SPAS in the convexly bent environment. In addition, the strategies for modulating the output power of the SPAS were demonstrated, which can be achieved by multi-stacking the SPAS or enlarging the area of the SPAS. The programmable integration of the SPAS pieces according to the requirement for series and parallel connections was demonstrated at twelve convexly-bent positions on the plastic substrate and at eight positions on the four human fingers wearing the rubber glove. The output voltage and current from these SPAS arrays were successfully observed.

Explanation of Experimental Procedures

Chemicals

Zinc nitrate hexahydrate ($Zn(NO_3)_2 \cdot 6H_2O$, 99.0%), hexamethylenetetramine (HMTA, $C_6H_{12}N_4$, 99+%) and anhydrous hexane were purchased from Aldrich. Zinc nitrate hexahydrate and HMTA were dissolved in deionized water under magnetic stirring for 30 minutes. Sylgard 184 PDMS (composed of prepolymer and curing agent) was purchased from Dow Corning Chemicals.

Synthesis of ZnO Nanorods

ZnO nanorods were prepared using hydrothermal synthesis. In this synthesis procedure, the inventors continuously added a Zn precursor solution into a hot HMTA solution using a syringe pump. In typical synthesis, two precursor solutions were prepared by separately dissolving 0.42 g zinc nitrate hexahydrate into 100 mL deionized water (at room temperature) and 0.24 g HMTA into 100 mL deionized water (at room temperature). The Zn precursor solution was injected continuously into the HMTA solution at a rate of 2 mL/h for 25 minutes using a syringe pump, with vigorous stirring at 85° C., and the process was completed after 5 minutes. After centrifugation, flocculated nanorods were isolated from supernatant, and washed three times with deionized water to remove unreacted $Zn^{2+}$ and other ions. Final precipitate was dried at 80° C. and thermal annealed at 400° C. for 2 hours in a vacuum to improve crystallinity.

Fabrication of SPAS

In order to fabricate SPAS, a slide glass (5×5 cm$^2$) spin-coated with a PEDOT:PSS layer (1 step: 500 rpm for 5 seconds, 2 step: 4000 rpm for 30 seconds) was used as a substrate. The PEDOT:PSS layer was used as an anti-adhesive layer between the PDMS and the substrate. Before the PDMS was used (with a curing agent at a ratio of 10:1), the PDMS and hexane were mixed at various ratios (PDMS to hexane ratios of 10:0, 7:3, 1:1 and 3:7) in order to control the thickness ratios of the PDMS. The PDMS and hexane mixtures were applied on the slide glass by spin coating at 3000 rpm for 30 seconds, and cured on a hot plate in the air at 85° C. for 30 minutes. After the coating, ZnO nanorods were arrayed in one direction as a film of nematic ZnO nanorods on the PDMS by rubbing with a piece of soft velvet cloth. Afterwards, a film of ZnO nanorods which are arrayed unidirectionally and stacked closely was made by repeating the coating of the PDMS and the rubbing of ZnO nanorods until an intended number of layers was obtained. Thereafter, Ag was deposited at a thickness of 200 nm on the top surface of the SPAS by thermal evaporation. Finally, conductive wires were connected to the Ag electrodes as leads for subsequent electrical measurement.

Measurement of Characteristics

The distribution of piezoelectric potential in biaxially-grown ZnO nanorods was calculated using COMSOL Multiphysics® in a finite element method. The morphology and crystalline structure of ZnO nanorods were observed using JEOL JSM-7000F field emission SEM (FESEM, 15 kV). A voltage and current generated thereby was measured using a pico-ammeter (keithley, 6485) and an electrometer/high resistance meter (Keithley, 6517).

Although the present invention has been described hereinabove with respect to the exemplary embodiments, it should be understood that the present invention is not limited to the foregoing embodiments.

For instance, although biaxially-grown nanorods according to the foregoing embodiments have been described as being fabricated by hydrothermal synthesis, the present invention is not limited thereby. Although the hydrothermal synthesis is used to synthesize a large amount of nanorods, chemical vapor deposition (CVD) is also applicable in order to form a small amount of nanorods having high crystallinity.

In addition, although the foregoing embodiment has been described with respect to an example in which the nanogenerator (NG) according to the preset invention is applied to the self-powered artificial skin (SPAS), this is merely for illustrative purposes. The applicability of the present invention is by no means limited to the SPAS.

As set forth above, the foregoing embodiments can be made into various alterations and modifications without departing from the scope of the appended Claims, and all such alterations and modifications fall within the scope of the present invention. Therefore, the present invention shall be defined by only the claims and their equivalents.

The invention claimed is:

1. A self-powered generator comprising a piezoelectric nanorod member layer that comprises:
    a first layer;
    a second layer; and
    a plurality of piezoelectric nanorods disposed between the first and second layers,
    wherein each of the plurality of piezoelectric nanorods is a biaxially-grown nanorod,
    wherein when mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis, and
    wherein the first and second layers are made of a dielectric material, which has a dielectric constant, is able to transfer the mechanical energy applied from the outside to the piezoelectric nanorods, and is able to transfer the piezoelectric potential generated from the plurality of piezoelectric nanorods to surfaces of the first and second layers, and wherein the first and second layers are flexible.

2. The self-powered generator according to claim 1, wherein the plurality of piezoelectric nanorods are arrayed unidirectionally between the first and second layers.

3. The self-powered generator according to claim 1, wherein the plurality of piezoelectric nanorods are arrayed such that a longitudinal direction thereof is parallel to a bending direction of the self-powered generator.

4. The self-powered generator according to claim 2, wherein the plurality of piezoelectric nanorods are arrayed unidirectionally to form a single layer between the first and second layers.

5. The self-powered generator according to claim 1, wherein the first and second layers are made of polydimethylsiloxane (PDMS).

6. The self-powered generator according to claim 1, wherein, the generator comprises a plurality of the piezoelectric nanorod member layers which are stacked one on another.

7. The self-powered generator according to claim 6, wherein a voltage and current generated from the generator increase as the number of the piezoelectric nanorod member layers increases.

8. A piezoelectric energy-harvesting device comprising:
    a piezoelectric nanorod member layer that comprises a first layer;
    a second layer; and
    a plurality of piezoelectric nanorods disposed between the first and second layers; and
    electrode layers formed on surfaces of the first and second layers,
    wherein each of the plurality of piezoelectric nanorods is a biaxially-grown nanorod,
    wherein when mechanical energy is applied from an outside, an upper half and a lower half of each of the plurality of piezoelectric nanorods generate piezoelectric potentials having opposite polarities, the upper half and the lower half being on both sides of a longitudinal axis along an axis perpendicular to the longitudinal axis, and
    wherein the first and second layers are made of a dielectric material, which has a dielectric constant, is able to transfer the mechanical energy applied from the outside to the piezoelectric nanorods, and is able to transfer the piezoelectric potential generated from the plurality of piezoelectric nanorods to surfaces of the first and second layers, and wherein the first and second layers are flexible.

9. The piezoelectric energy-harvesting device according to claim 8, wherein the plurality of piezoelectric nanorods are arrayed unidirectionally between the first and second layers.

10. The piezoelectric energy-harvesting device according to claim 9, wherein the plurality of piezoelectric nanorods are arrayed such that a longitudinal direction thereof is parallel to a bending direction of the piezoelectric energy-harvesting device.

11. The piezoelectric energy-harvesting device according to claim 8, wherein the plurality of piezoelectric nanorods are arrayed unidirectionally to form a single layer between the first and second layers.

12. The piezoelectric energy-harvesting device according to claim 8, further comprises a plurality of the piezoelectric nanorod member layers.

13. The piezoelectric energy-harvesting device according to claim 12, wherein a voltage and current generated from the generator increase as the number of the piezoelectric nanorod member layers increases.

14. The piezoelectric energy-harvesting device according to claim 12, wherein the plurality of piezoelectric nanorod member layers are connected in series.

15. The piezoelectric energy-harvesting device according to claim 8, wherein the plurality of biaxially grown piezoelectric nanorods are fabricated by hydrothermal synthesis.

16. The piezoelectric energy-harvesting device according to claim 8, wherein the first and second layers are made of PDMS.

\* \* \* \* \*